(12) United States Patent
Ogata et al.

(10) Patent No.: US 8,890,186 B2
(45) Date of Patent: Nov. 18, 2014

(54) MOLDED RESIN PRODUCT, SEMICONDUCTOR LIGHT-EMITTING SOURCE, LIGHTING DEVICE, AND METHOD FOR MANUFACTURING MOLDED RESIN PRODUCT

(75) Inventors: Toshifumi Ogata, Osaka (JP); Nobuyuki Matsui, Osaka (JP); Masumi Abe, Osaka (JP)

(73) Assignee: Panasonic Corporation, Osaka (JP)

( * ) Notice: Subject to any disclaimer, the term of this patent is extended or adjusted under 35 U.S.C. 154(b) by 206 days.

(21) Appl. No.: 12/867,728

(22) PCT Filed: Mar. 17, 2009

(86) PCT No.: PCT/JP2009/001175
§ 371 (c)(1),
(2), (4) Date: Dec. 14, 2010

(87) PCT Pub. No.: WO2009/119038
PCT Pub. Date: Oct. 1, 2009

(65) Prior Publication Data
US 2011/0084297 A1     Apr. 14, 2011

(30) Foreign Application Priority Data

Mar. 28, 2008   (JP) .................................. 2008-087734

(51) Int. Cl.
*H01L 33/00* (2010.01)
*F21K 99/00* (2010.01)
(Continued)

(52) U.S. Cl.
CPC ........... *B29C 33/0016* (2013.01); *H01L 33/501* (2013.01); *F21V 17/10* (2013.01);
(Continued)

(58) Field of Classification Search
CPC ......... H01L 33/52; H01L 33/54; H01L 33/56; H01L 33/58; F21K 9/00; F21K 9/135; F21V 15/02
USPC .............. 257/98, 99, 100, E31.099, E27.051, 257/E29.327, E25.032, E21.053, E31.105
See application file for complete search history.

(56) References Cited

U.S. PATENT DOCUMENTS 4,152,618 A * 5/1979 Abe et al. ....................... 313/116
4,959,762 A * 9/1990 Soileau .......................... 362/376
(Continued)

FOREIGN PATENT DOCUMENTS

| CA | 2487697 | 5/2006 |
|---|---|---|
| EP | 1220332 | 7/2002 |

(Continued)

OTHER PUBLICATIONS

English Abstract of JP 04243695 A.*
(Continued)

*Primary Examiner* — Anthony Ho
*Assistant Examiner* — David Chen

(57) ABSTRACT

A molded resin product or the like that is provided with a phosphor layer made of gel-like or rubber-like resin that can maintain its shape for a long period and that can be implemented easily. The molded resin product (phosphor layer 7) includes a resin member 17 made of a gel-like or rubber-like translucent resin including a phosphor material. The resin member 17 includes a shape maintaining member 19 that is formed in a lattice shape by line-like members 20 that are made of a material having a higher elasticity modulus than the resin member 17. The molded resin product (phosphor layer 7) is in the shape of a dome. The translucent resin is made of, for example, silicon resin, and the resin member 17 is gel-like.

8 Claims, 14 Drawing Sheets

(51) Int. Cl.
| | |
|---|---|
| *F21V 3/04* | (2006.01) |
| *F21V 3/02* | (2006.01) |
| *B29C 33/00* | (2006.01) |
| H01L 33/50 | (2010.01) |
| F21V 17/10 | (2006.01) |
| H01L 33/58 | (2010.01) |
| H01L 25/075 | (2006.01) |
| F21Y 101/02 | (2006.01) |

(52) U.S. Cl.
CPC . *H01L 33/58* (2013.01); *F21K 9/56* (2013.01); *H01L 2224/48091* (2013.01); *H01L 25/0753* (2013.01); *F21V 3/0481* (2013.01); *F21V 3/02* (2013.01); *H01L 2224/45144* (2013.01); *F21K 9/135* (2013.01); *F21Y 2101/02* (2013.01)
USPC ........ 257/98; 257/99; 257/100; 257/E21.053; 257/E25.032; 257/E27.051; 257/E29.327; 257/E31.099; 257/E31.105

(56) References Cited

U.S. PATENT DOCUMENTS

| | | | | |
|---|---|---|---|---|
| 5,725,303 | A * | 3/1998 | Lin | 362/376 |
| 6,291,369 | B1 | 9/2001 | Yoshikawa et al. | |
| 7,825,423 | B2 * | 11/2010 | Shiraishi et al. | 257/98 |
| 2001/0050371 | A1 * | 12/2001 | Odaki et al. | 257/98 |
| 2002/0106952 | A1 | 8/2002 | Hashizume et al. | |
| 2005/0253153 | A1 | 11/2005 | Harada | |
| 2007/0262336 | A1 * | 11/2007 | Tamaki et al. | 257/98 |
| 2007/0267643 | A1 * | 11/2007 | Harada et al. | 257/98 |
| 2007/0293623 | A1 | 12/2007 | Kashiwagi et al. | |
| 2008/0023721 | A1 | 1/2008 | Lee et al. | |
| 2008/0029720 | A1 | 2/2008 | Li | |

FOREIGN PATENT DOCUMENTS

| | | | |
|---|---|---|---|
| EP | 1 589 591 | | 10/2005 |
| EP | 1953834 | | 8/2008 |
| JP | 04243695 A | * | 8/1992 |
| JP | 2005166733 | | 6/2005 |
| JP | 2005311170 | | 11/2005 |
| JP | 2007035802 A | * | 2/2007 |
| TW | 200644284 | | 2/1995 |
| TW | 200729566 | | 9/2005 |
| TW | M313317 | | 12/2005 |
| TW | 200813160 | | 3/2008 |
| TW | 200814377 | | 3/2008 |
| WO | 2006/059828 | | 6/2006 |
| WO | 2007/015732 | | 2/2007 |
| WO | 2007/057983 | | 5/2007 |

OTHER PUBLICATIONS

Young's modulus, Wikipedia.*
Elastic Properties and Young Modulus for some Materials, The Engineering ToolBox.*
E-Glass Fibre by AZoM.com, Aug. 30, 2001.*
Machine Translation for JP 2007-035802 A.*
European Patent Application No. 09725291.0 Office Action dated Dec. 4, 2013, 5 pages.
Taiwan Application No. 098109345 Office Action, 8 pages with partial English translation.

* cited by examiner

[Fig. 1]
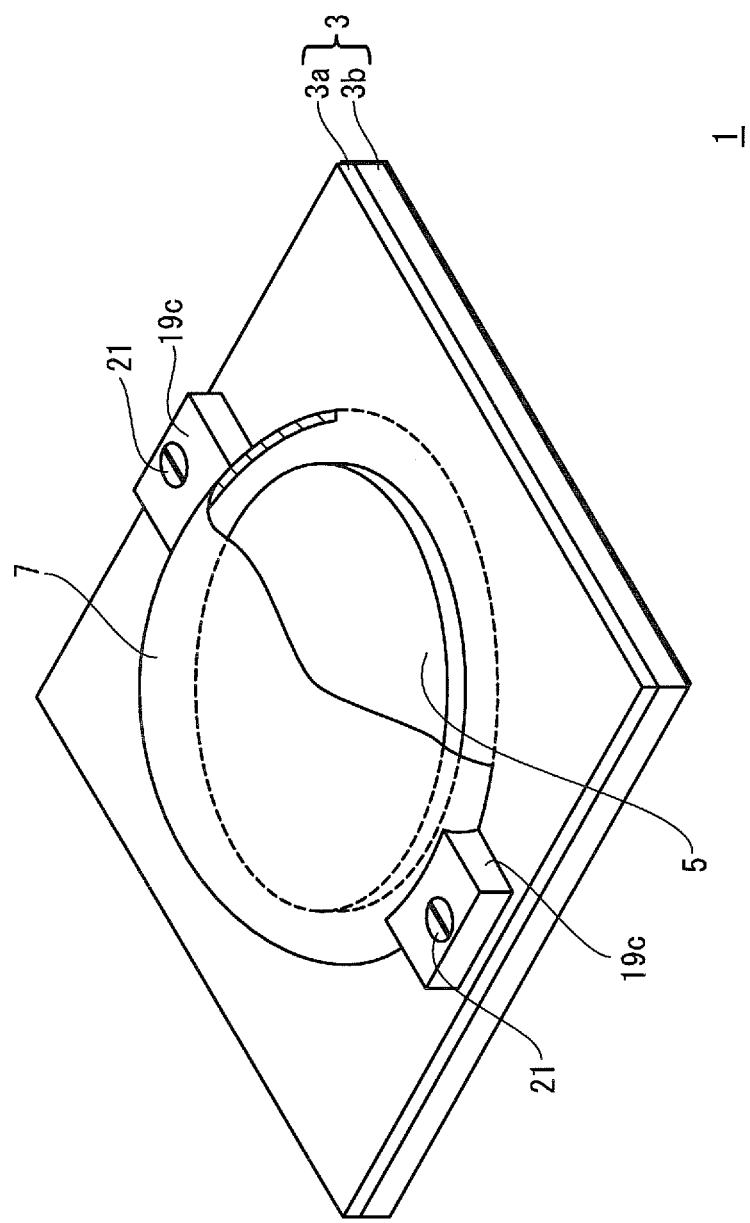

[Fig. 2]
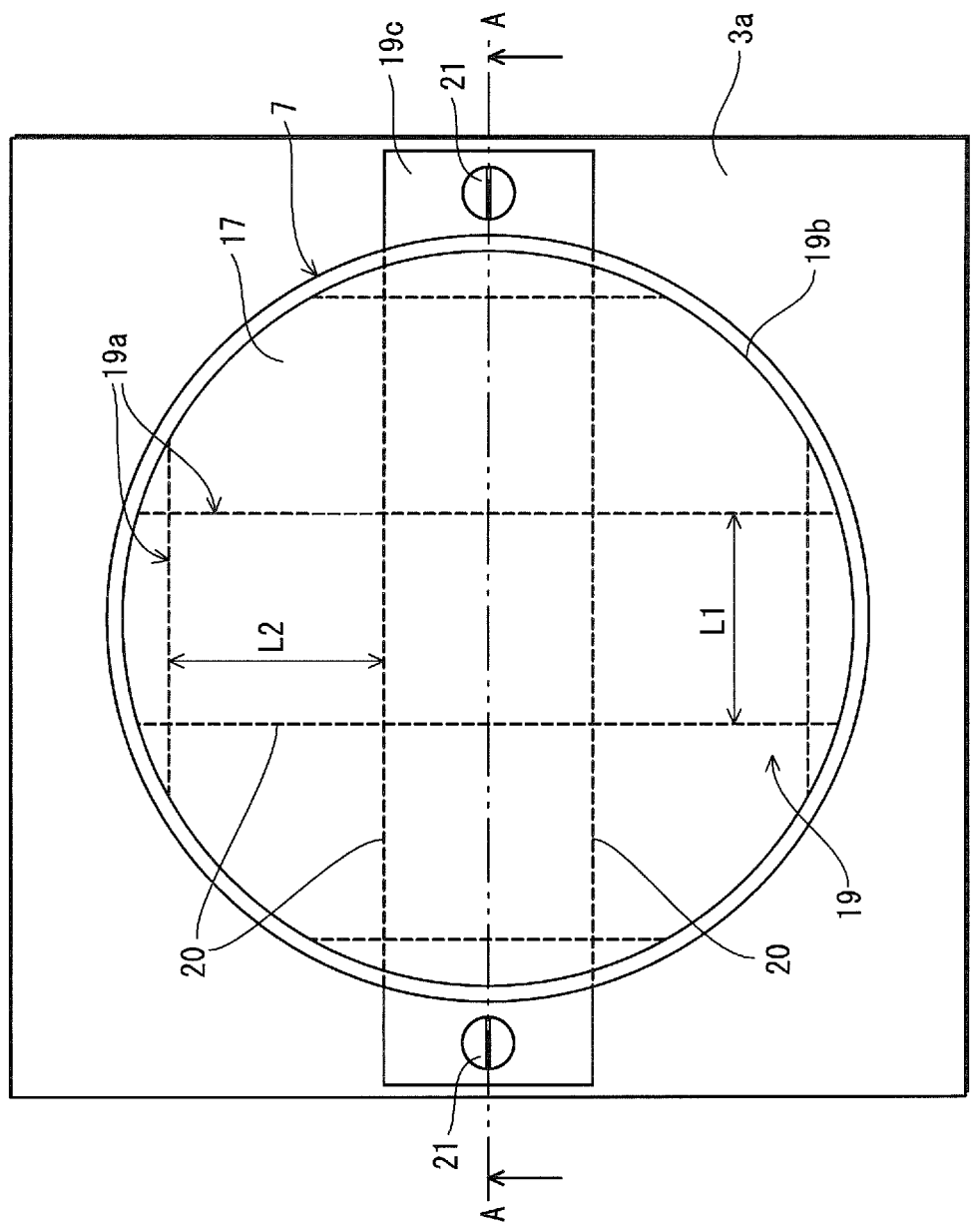

[Fig. 3]
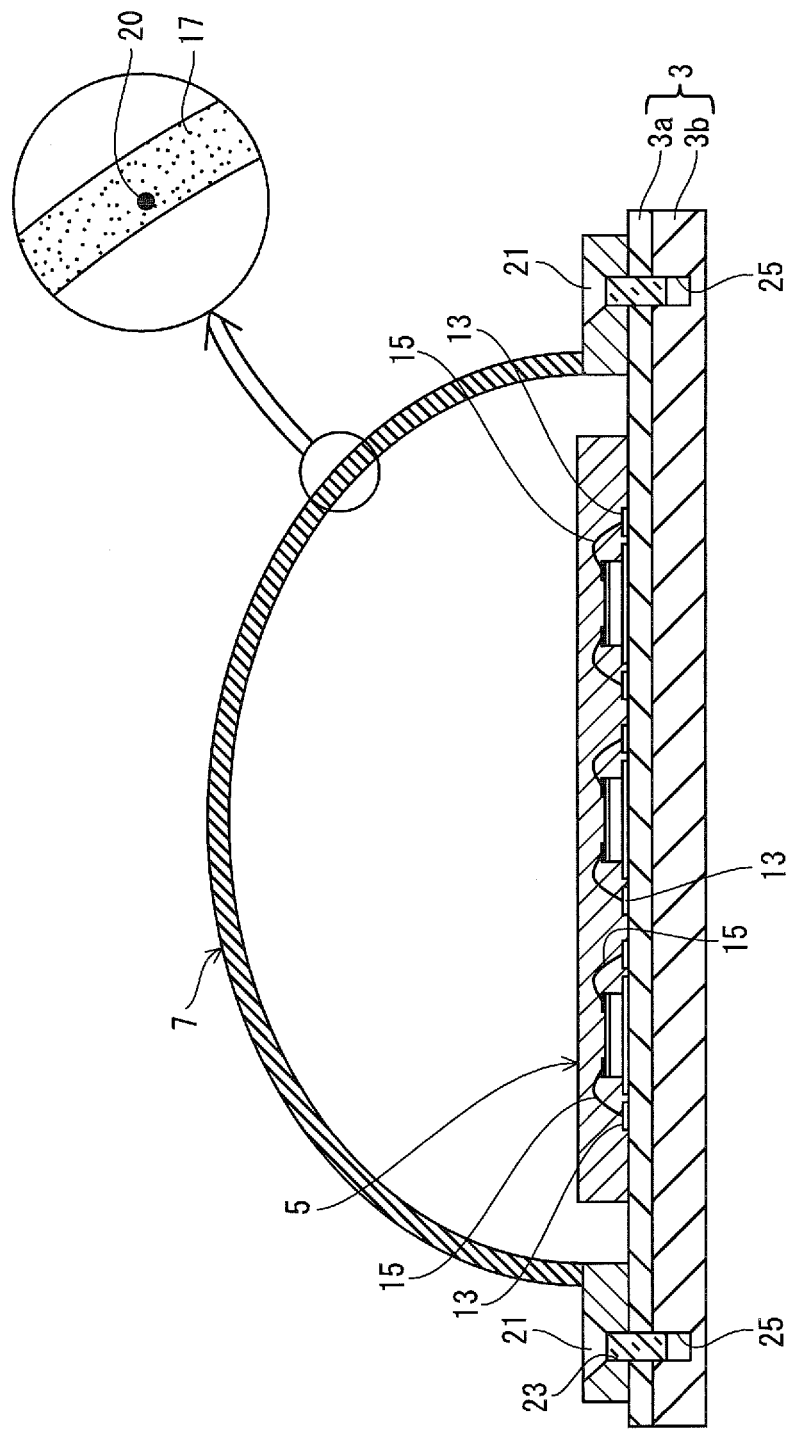

[Fig. 4]
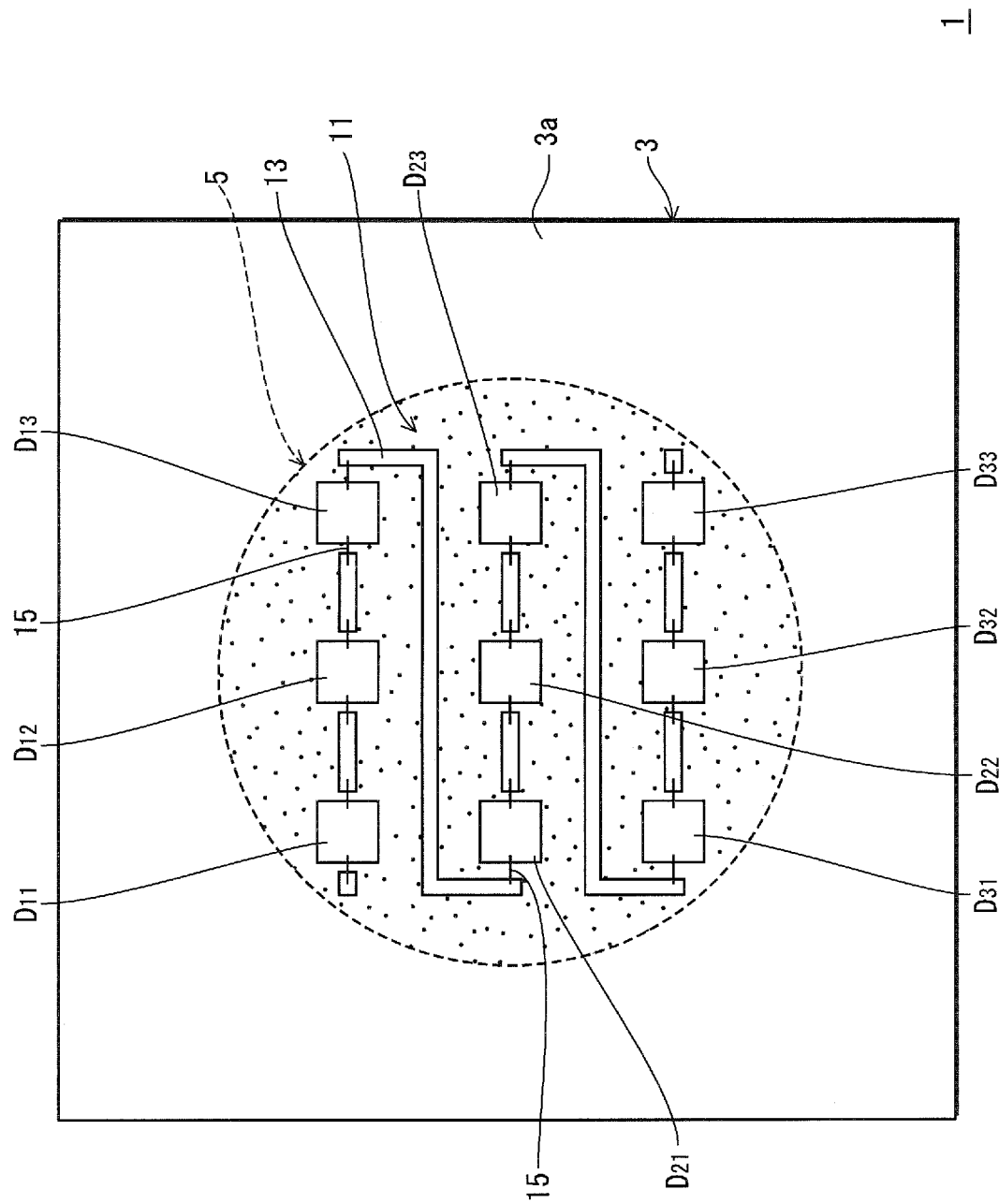

[Fig. 5]
State a
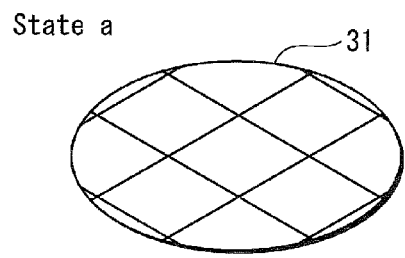
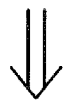
State b
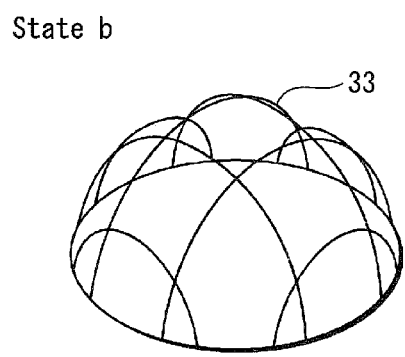
Method A
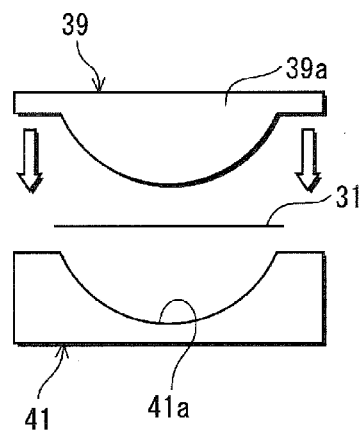
Method B
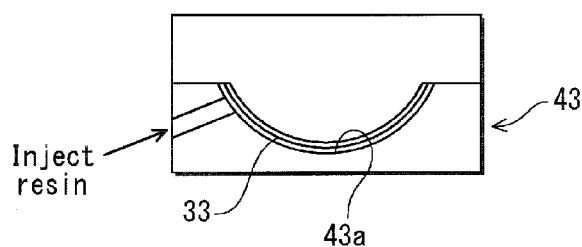
State c
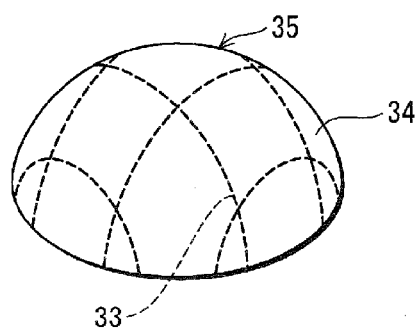

[Fig. 6]
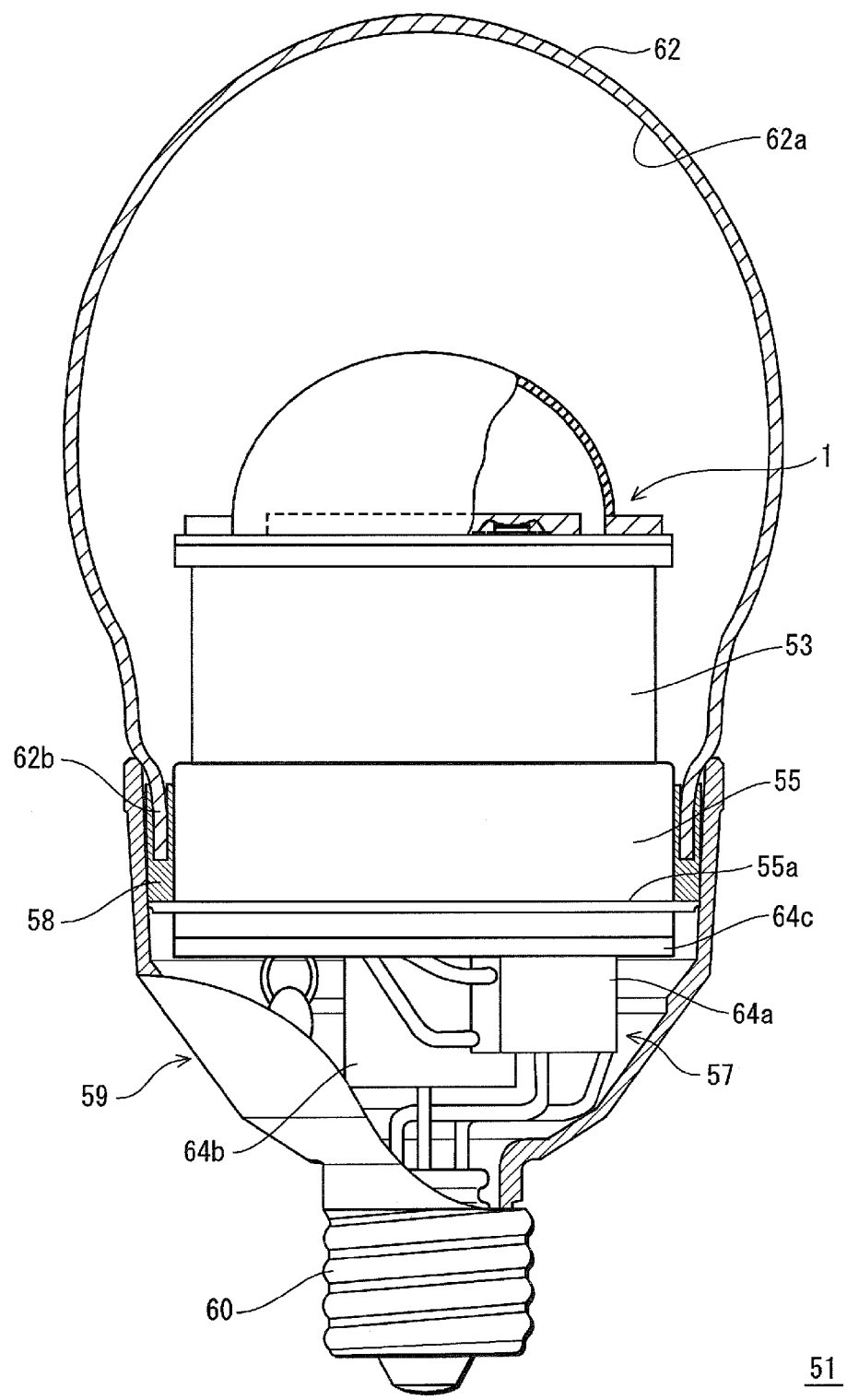

[Fig. 7]
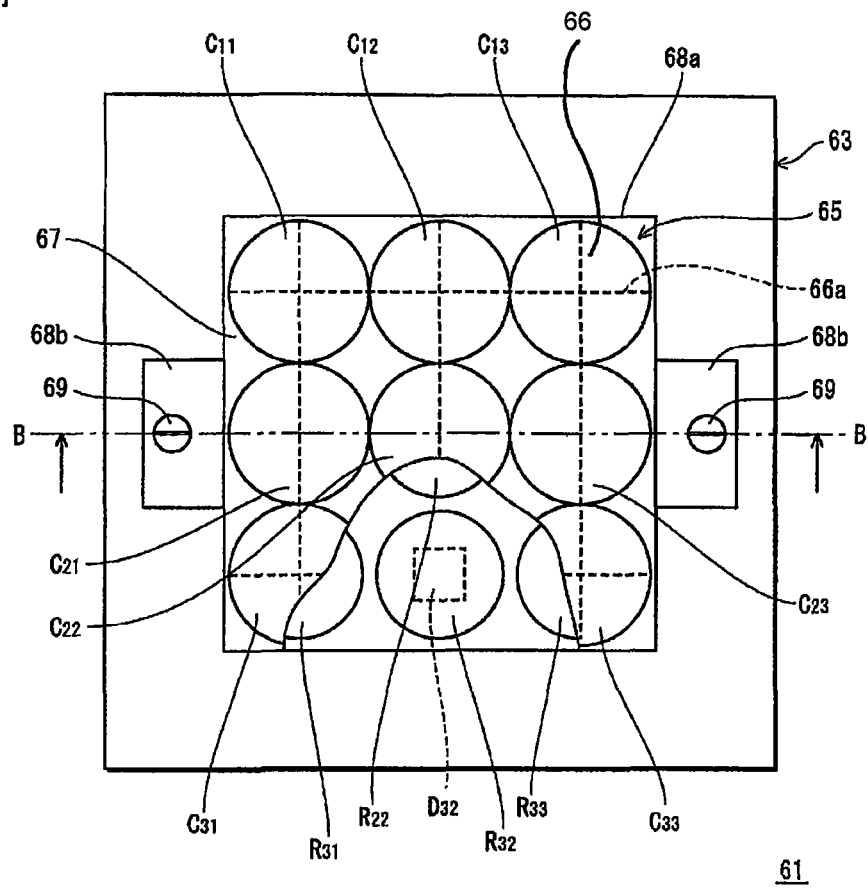
[Fig. 8]
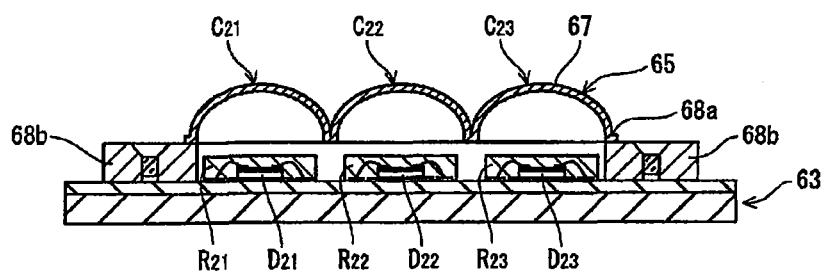

[Fig. 9-A]
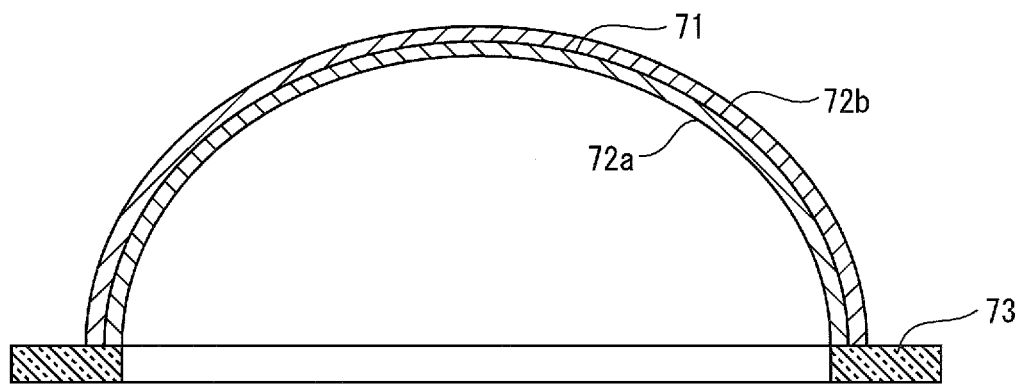
[Fig. 9-B]
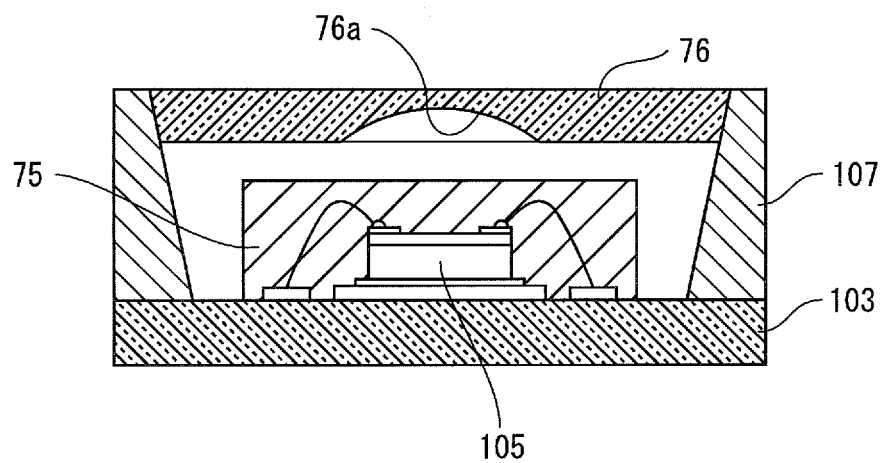

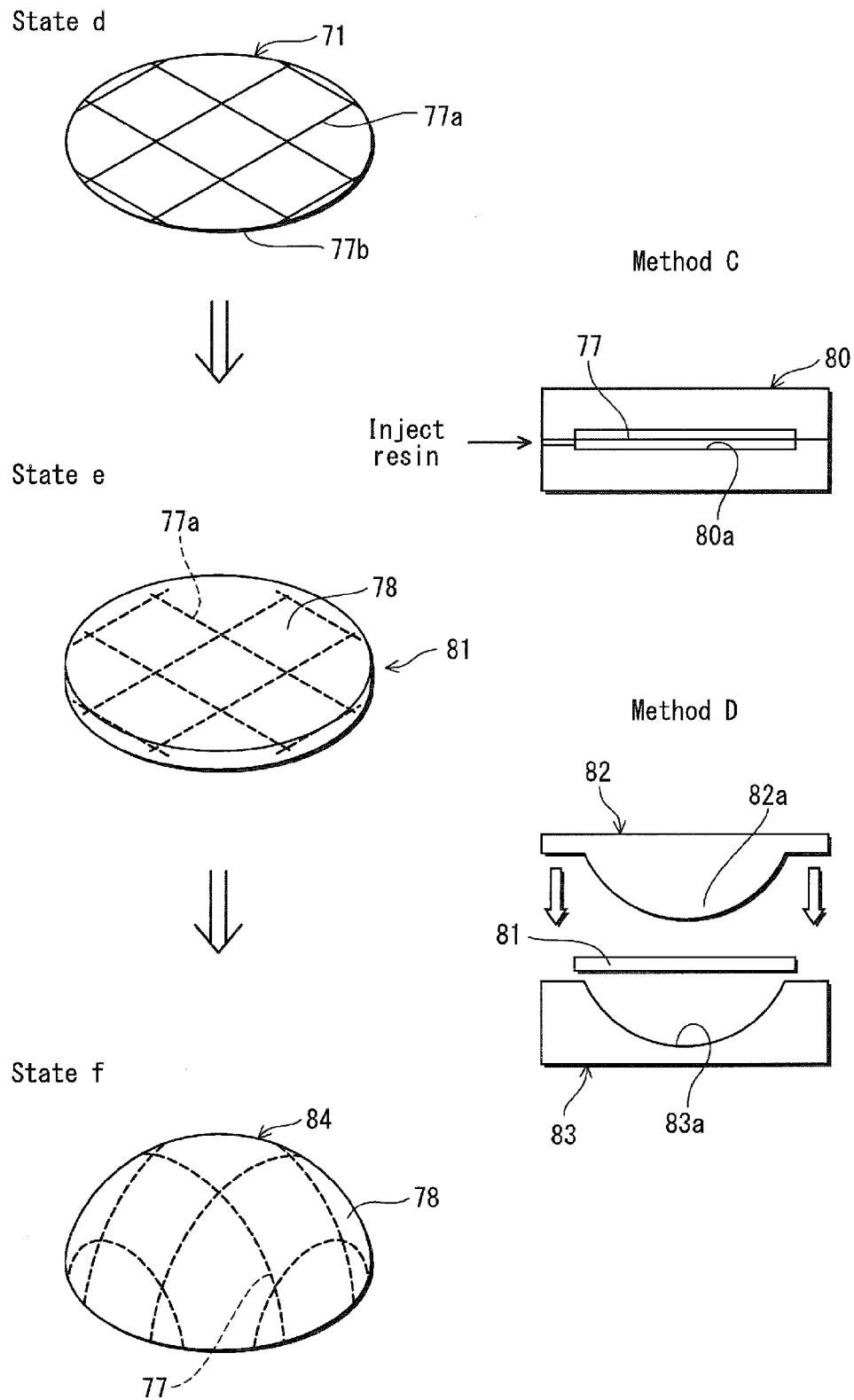
[Fig. 10]

[Fig. 11-A]
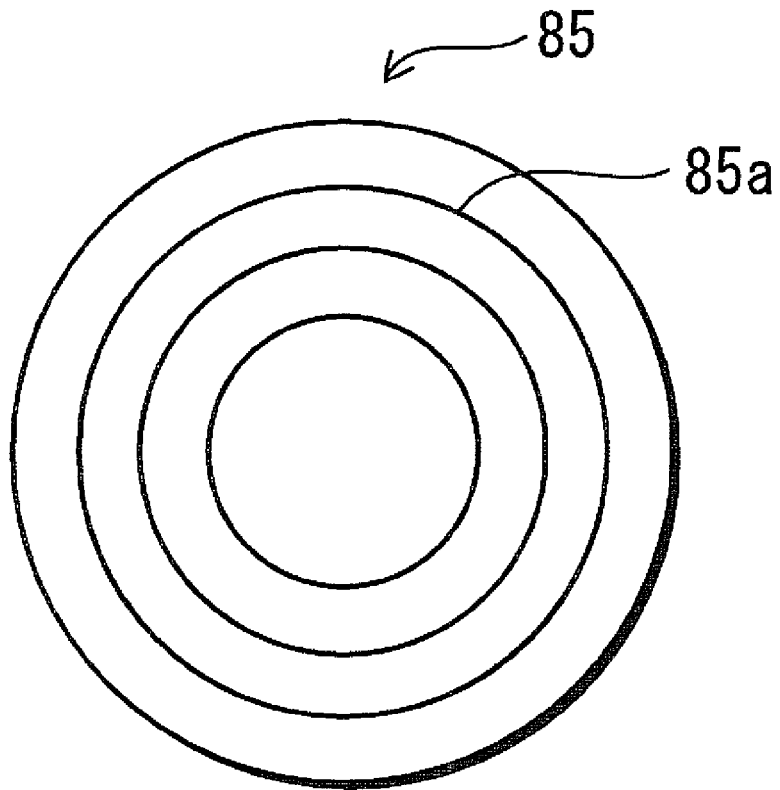
[Fig. 11-B]
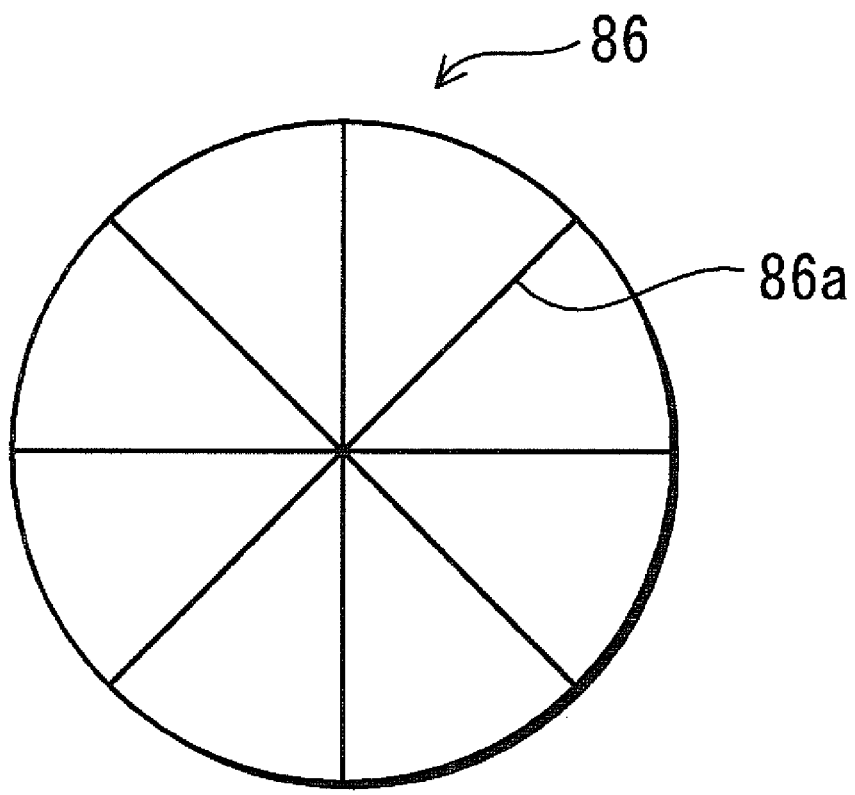

[Fig. 11-C]
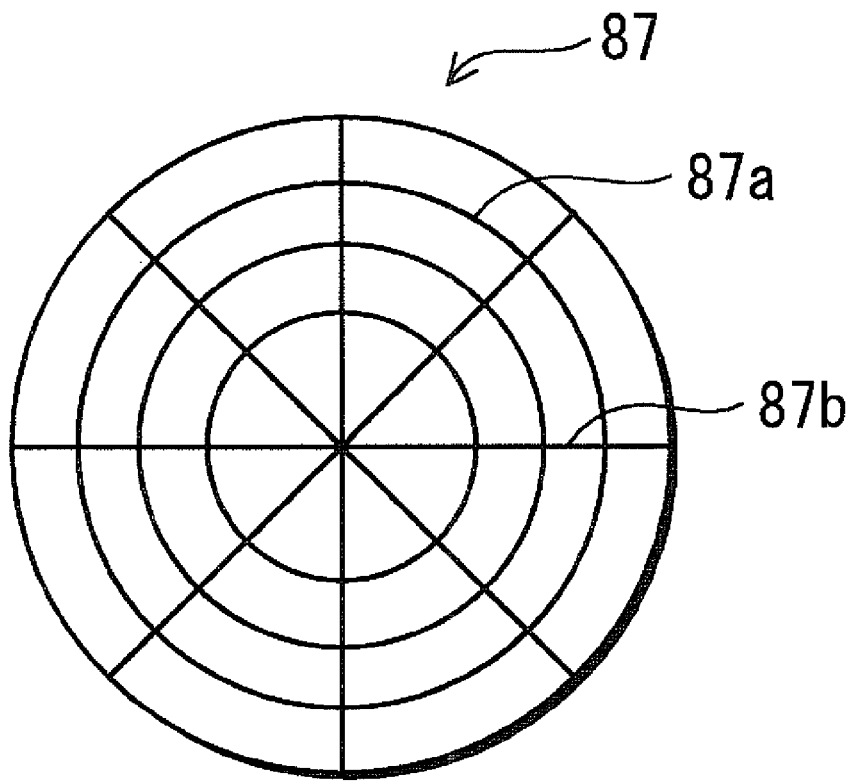
[Fig. 11-D]
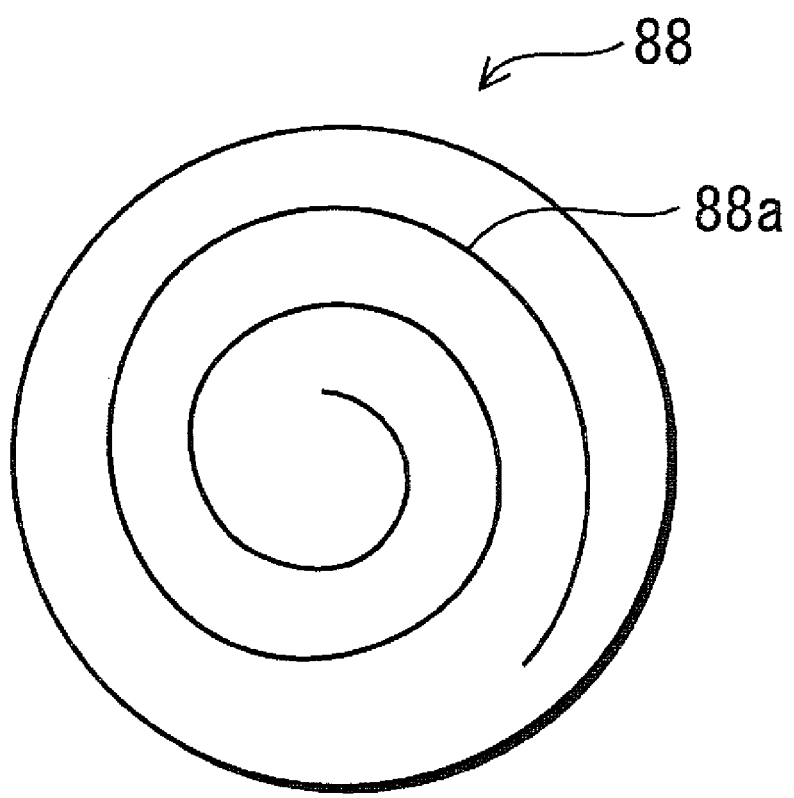

[Fig. 11-E]
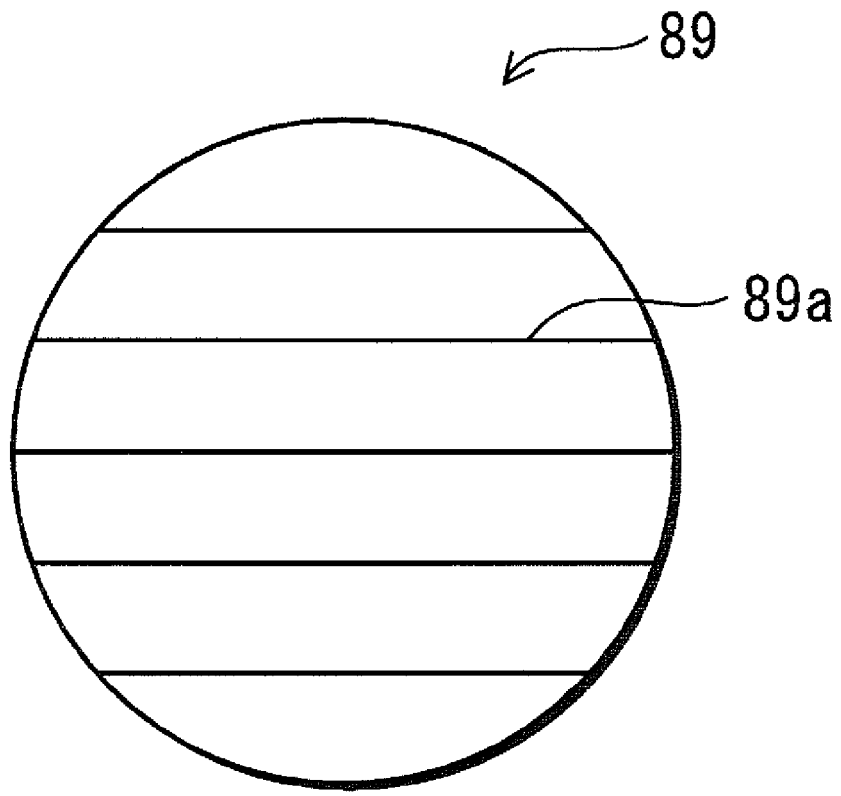
[Fig. 11-F]
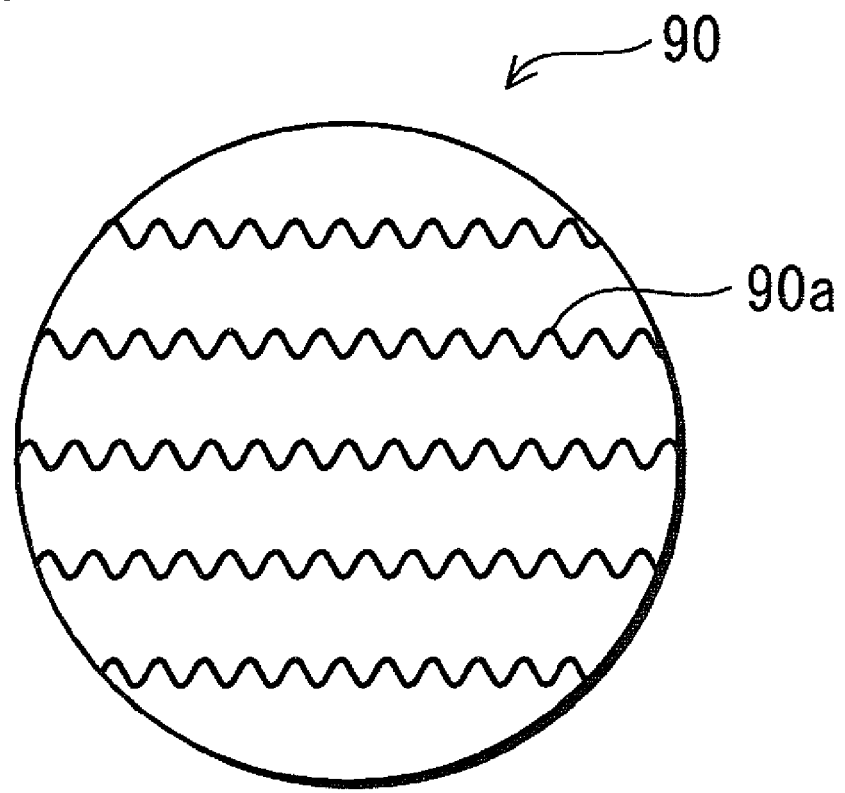

[Fig. 12]
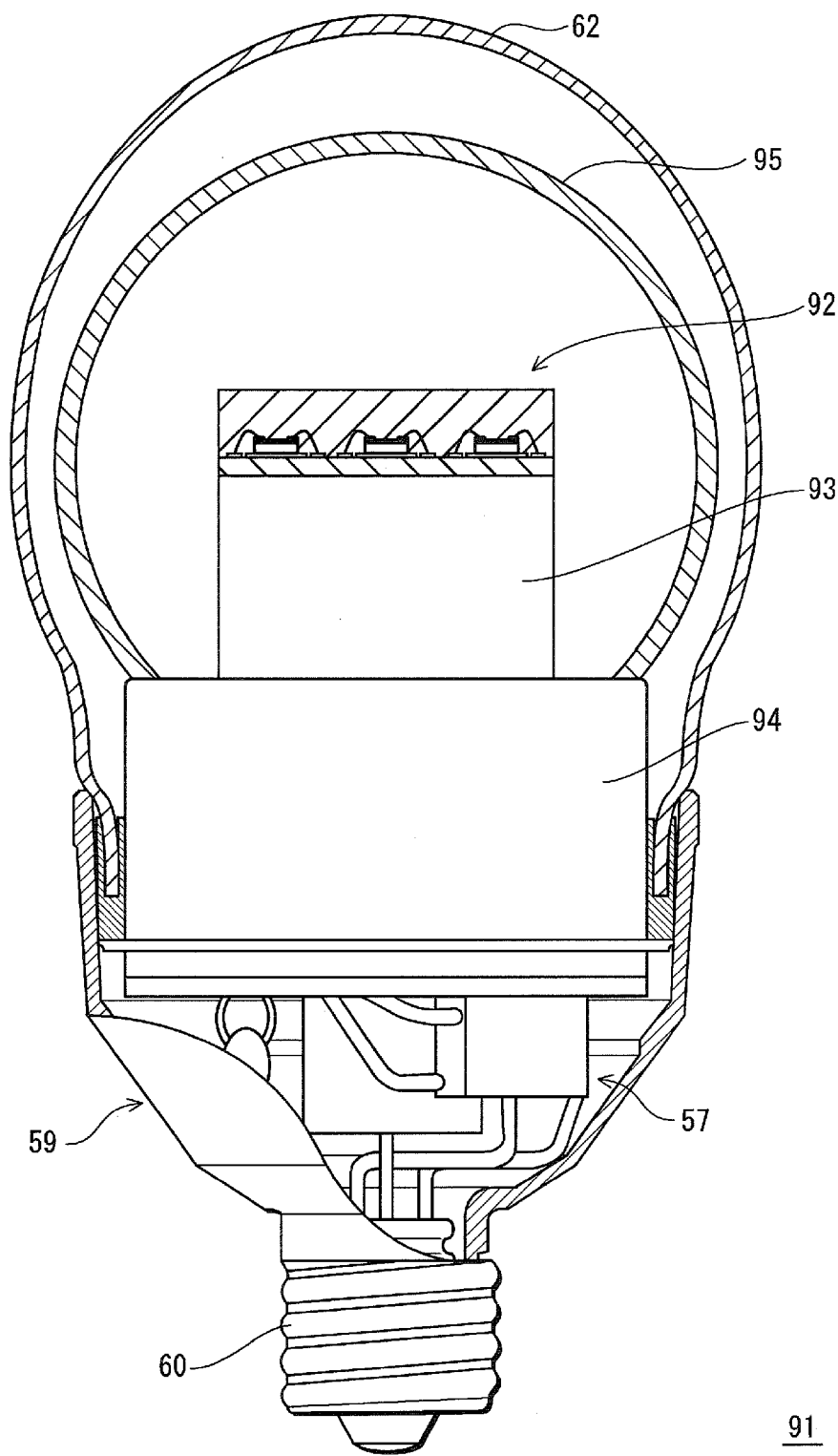

[Fig. 13]
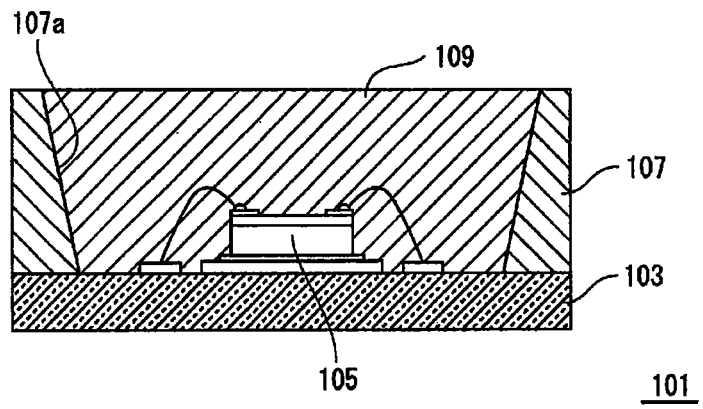
PRIOR ART
[Fig. 14]
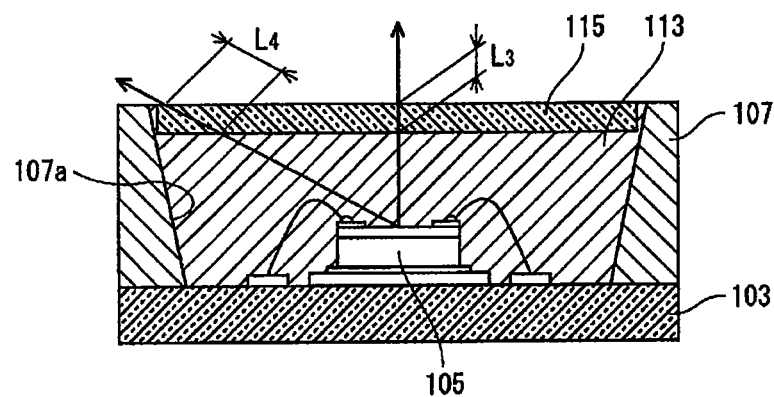
PRIOR ART
[Fig. 15]
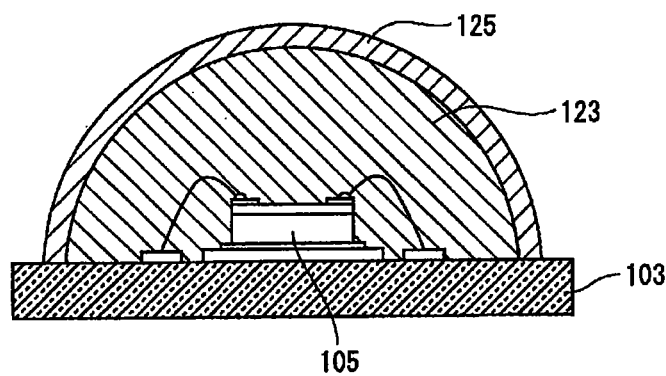
PRIOR ART

MOLDED RESIN PRODUCT, SEMICONDUCTOR LIGHT-EMITTING SOURCE, LIGHTING DEVICE, AND METHOD FOR MANUFACTURING MOLDED RESIN PRODUCT

TECHNICAL FIELD

The present invention relates to a molded resin product which includes a phosphor material for converting the light emitted from a semiconductor light-emitting element being a light source into a desired color, a method for manufacturing the molded resin product, and a semiconductor light-emitting source and a lighting device that use the molded resin product.

BACKGROUND ART

In recent years, as the light-emission efficiency of the semiconductor light-emitting element such as the LED element has improved, the application thereof to the light source for lighting or the like has progressed at rapid pace.

FIGS. 13 to 15 show one example of the light-emitting source in which the LED element is used.

A light-emitting source 101, as shown in FIG. 13, is provided with an LED element 105 implemented, as the light source, on a main surface of a substrate 103. The LED element 105 is sealed with resin that includes a phosphor material in the state where the LED element 105 is disposed in a reflection hole of a reflection plate 107. Note that the resin used to seal the LED element 105 is called a sealing resin member 109. A circumferential surface constituting a reflection surface 107a reflects the light coming from the LED element 105 so that it travels in a predetermined direction (see Patent Document 1 identified below).

With the above-described structure, the light emitted from the LED element 105 is converted into a desired color by the phosphor material contained in the sealing resin member 109 as the light passes through the sealing resin member 109, and then either directly emitted from the light-emitting source 101 or reflected by the reflection surface 107a to travel in a predetermined direction and then emitted from the light-emitting source 101.

As the material of the sealing resin member 109 provided in the light-emitting source 101, epoxy resin, olefin resin or the like has been used conventionally. However, there is a problem with these resins that, when such a resin is used for a long time, the color of the sealing resin member 109 changes due to, for example, the heat that is generated as the LED element 105 emits light, resulting in reduction of the amount of light emitted from the light-emitting source 101.

A typical trend in solving the above-described problem in recent years is that, as shown in FIG. 14 or 15, a resin that does not include a phosphor material is used as the resin for sealing the LED element 105 (this resin is also sealing resin member and is represented by reference numbers 113 and 123), and that a resin including a phosphor material (this resin is called phosphor layer and is represented by reference numbers 115 and 125) is also used independently of the sealing, resin members 113 and 123, where a gel-like or rubber-like resin such as a silicone resin is used as the phosphor layers 115 and 125 (see Patent Document 2 identified below).

It should also be noted here that the phosphor layers 115 and 125 may be made respectively in the shape of a plate with substantially constant thickness and in the shape of a dome, as shown in FIGS. 14 and 15, so that the light path lengths (examples of which are L3 and L4 shown in FIG. 14) of the light passing through the phosphor layer after passing through the sealing resin member 113 or 123 can be equalized, preventing an occurrence of color unevenness.

Patent Citation 1: Japanese Patent Application Publication No. 2005-311170

Patent Citation 2: Japanese Patent Application Publication No. 2005-166733

DISCLOSURE OF INVENTION

Problems Solved by the Invention

However, there is a problem with this structure as well. That is to say, when the phosphor layers 115 and 125 shown in FIGS. 14 and 15 are made of gel-like or rubber-like resin, the phosphor layers 115 and 125 change in shape with time, resulting in deterioration of appearance, expansion of color unevenness and the like.

To prevent this problem from occurring, in light-emitting sources 111 and 121 shown in FIGS. 14 and 15, the sealing resin members 113 and 123 are filled in the space between the LED element 105 and the phosphor layers 115 and 125, respectively.

An object of the present invention is therefore to provide a molded resin product, semiconductor light-emitting source, lighting device, and method for manufacturing the molded resin product that are provided with a phosphor layer made of gel-like or rubber-like resin that can maintain its shape for a long period without using the sealing resin members shown in FIGS. 14 and 15, and that can be implemented easily.

Means to Solve the Problem

The above-described object is fulfilled by a molded resin product, comprising: a resin member made of a translucent resin including a phosphor material; and a shape maintaining member that is made of a material having a higher elasticity modulus than the resin member, and that is provided either inside or on an outer surface of the resin member to maintain a shape of the resin member.

Effects of the Invention

The molded resin product of the present invention includes a shape maintaining member either inside or on an outer surface of the resin member. With this structure, the shape of the resin member is maintained for a long period by itself.

In the above-stated molded resin product, the resin member may have a convex part or a concave part. Also, In the above-stated molded resin product which is for use with a semiconductor light-emitting element as a light source, the resin member may have a convex part whose inside is hollow, and the convex part is in a shape of a circular arc in a longitudinal section, and radius of the circular arc is set such that a center of light-emission is located at a center of the circular arc and located in a vicinity of the circular arc center.

Note that a shape in a longitudinal section means a shape in a cross section taken along a plane that is perpendicular to a direction in which the convex part projects out.

In the above-stated molded resin product, the shape maintaining member may be composed of one or more line-like members. Also, in the above-stated molded resin product, the shape maintaining member, in a plan view, may be in one of a spiral shape, a lattice shape, a parallel-line shape, and a radiation shape, or in a shape which is a combination of two or more of the spiral shape, the lattice shape, the parallel-line shape, and the radiation shape.

Note that a shape in a plan view means a shape of the shape maintaining member when viewed in a direction in which the shape maintaining member has the largest area.

In the above-stated molded resin product, the line-like members may have been wound in a coil shape in a longitudinal direction of the line-like members. Also, in the above-stated molded resin product, the resin member may have gel-like or rubber-like elasticity. Further, in the above-stated molded resin product, the resin member may be A80 or less in shore hardness.

In the above-stated molded resin product, the translucent resin may include at least one of a silicone resin and a fluorine resin. Also, in the above-stated molded resin product, the resin member may include, either inside or in an outer surface thereof, at least one of a pigment and a light diffusion material. Further, in the above-stated nolded resin product, the convex part may contain a light diffusion material inside thereof, and contain a phosphor material outside thereof.

In the above-stated molded resin product, the shape maintaining member may be made of at least one material selected from the group consisting of metal, glass, ceramic, and resin. In the above-stated molded resin product, the shape maintaining frame may have an outer circumferential frame on a circumference thereof. In the above-stated molded resin product, the outer circumferential frame may be provided with a frame pad.

The above-described object is also fulfilled by a semiconductor light-emitting source, comprising: a substrate; a semiconductor light-emitting element that has been implemented on the substrate; and the above-stated molded resin product.

In the above-stated semiconductor light-emitting source, a phosphor layer that is different from the molded resin product may be disposed in a vicinity of the semiconductor light-emitting element.

The above-described object is further fulfilled by a lighting device characterized by comprising the above-described semiconductor light-emitting source as a light source.

The above-described object is further fulfilled by a method for manufacturing a molded resin product which includes a translucent resin member and a shape maintaining member, the translucent resin member having a convex part or a concave part, at least one of the convex part and the concave part including a phosphor material, the shape maintaining member maintaining a shape of the translucent resin member, the method comprising: a first step in which the translucent resin member is formed such that the shape maintaining member functions as a bony framework of the translucent resin member; and a second step in which a part or all of the translucent resin member, which includes the shape maintaining member as a result of the first step, is compressed into a convex shape or a concave shape.

The above-described object is further fulfilled by a method for manufacturing a molded resin product which includes a translucent resin member and a shape maintaining member, the translucent resin member having a convex part or a concave part, at least one of the convex part and the concave part including a phosphor material, the shape maintaining member maintaining a shape of the translucent resin member, the method comprising: a first step in which the shape maintaining member is deformed into a convex shape or a concave shape; and a second step in which the translucent resin member is formed such that the deformed shape maintaining member functions as a bony framework of the translucent resin member, wherein the first step and the second step are performed in sequence in the stated order.

BRIEF DESCRIPTION OF THE DRAWINGS

FIG. 1 is a perspective view of a light-emitting source in Mode for the Invention 1, where a phosphor layer is partially cut away to show its inside.

FIG. 2 is a plan view of the light-emitting source.

FIG. 3 is a sectional view taken along the line A-A of FIG. 2, looking in the direction of the arrows.

FIG. 4 is a plan view of the light-emitting source in the state where the phosphor layer has been removed.

FIG. 5 shows a method for forming the phosphor layer and interim states thereof during formation.

FIG. 6 shows a lighting device in Mode for the Invention 2.

FIG. 7 is a plan view of a light-emitting source in Modification 1.

FIG. 8 is a sectional view taken along the line B-B of FIG. 7, looking in the direction of the arrows.

FIG. 9A is a longitudinal sectional view of a molded resin product in Modification 2-1.

FIG. 9B is a longitudinal sectional view of a molded resin product in Modification 2-2.

FIG. 10 shows a method for manufacturing the molded resin product in Modification 3.

FIG. 11A shows one example of the structures of the shape maintaining member in a modification.

FIG. 11B shows one example of the structures of the shape maintaining member in a modification.

FIG. 11C shows one example of the structures of the shape maintaining member in a modification.

FIG. 11D shows one example of the structures of the shape maintaining member in a modification.

FIG. 11E shows one example of the structures of the shape maintaining member in a modification.

FIG. 11F shows one example of the structures of the shape maintaining member in a modification.

FIG. 12 shows a lighting device in Mode for the Invention 2.

FIG. 13 is a front sectional view of a conventional lighting device.

FIG. 14 is a front sectional view of a conventional lighting device.

FIG. 15 is a front sectional view of a conventional lighting device.

DESCRIPTION OF CHARACTERS 1. 61 Light-emitting source
7, 65 Phosphor layer
17, 67 Resin member
19, 66 Shape maintaining member
19a Lattice-shaped part
19b, 68a Outer circumferential frame
19c, 68b Frame pad
20, 66a Line-like members
51 Lighting device
Dnm LED element
Cnm Convex part

BEST MODE FOR CARRYING OUT THE INVENTION

Mode for the Invention 1

The following describes a light-emitting source (corresponding to semiconductor light-emitting source of the present invention) in Mode for the Invention 1 of the present invention, and a method for manufacturing a phosphor layer (corresponding to molded resin product of the present invention) in Mode for the Invention 1, with reference to the attached drawings. Note that, although an LED element is used as the semiconductor light-emitting element in the example described in Mode for the Invention 1, an element such as a semiconductor laser having been manufactured through a semiconductor process may be used as the semiconductor light-emitting element.

1. Overall Structure

FIG. 1 is a perspective view of a light-emitting source 1 in Mode for the Invention 1, where a phosphor layer 7 is partially cut away to show its inside.

The light-emitting source 1 includes a substrate 3, LED elements, a sealing member 5, and a phosphor layer 7, where the substrate 3 has a wiring pattern on the main surface, the LED elements (corresponding to semiconductor light-emitting element of the present invention) are implemented on the main surface of the substrate 3, the sealing member 5 covers and seals the LED elements, and the phosphor layer 7 converts the light emitted from the LED elements into a desired color. Note that in FIG. 1, the LED elements and the wiring pattern, which are provided in the sealing member 5, are not appearing.

FIG. 2 is a plan view of the light-emitting source 1. FIG. 3 is a sectional view taken along the line A-A of FIG. 2, looking in the direction of the arrows. FIG. 4 is a plan view of the light-emitting source 1 in the state where the phosphor layer 7 and a part of the sealing member 5 have been removed to show a wiring pattern 13 in the sealing member 5 and LED elements Dnm.

As shown in FIG. 4, the substrate 3 is in the shape of, for example, a square in a plan view, and includes, in the center thereof, an implementation area 11 in which the LED elements are to be implemented. The wiring pattern 13 for electrically connecting the implemented LED elements is formed in the implementation area 11.

Also, as shown in FIG. 3, the substrate 3 has a two-layer structure composed of an insulating layer 3a and a metal base 3b, and the wiring pattern 13 is formed on the main surface of the insulating layer 3a.

In Mode for the Invention 1, nine LED elements, represented by sign Dnm, are arranged in a square matrix of three rows by three columns, where n represents an integer ranging from 1 to 3 indicating the number of rows, and m represents an integer ranging from 1 to 3 indicating the number of columns.

The wiring pattern 13 is formed to connect the nine LED elements Dnm, for example, in series. The LED elements Dnm are a single surface electrode type in which both the P-type electrode and the N-type electrode are provided, for example, on the upper surface. As shown in FIGS. 3 and 4, the LED elements Dnm are connected with the wiring pattern 13 via a wire (gold wire) 15. Note that an illustration of the power supply terminals for supplying power to the LED elements Dnm is omitted.

The sealing member 5, as shown in FIGS. 1, 3 and 4, covers the nine LED elements Dnm and is in the shape of a cylinder which is seen as a circle in a plan view.

The phosphor layer 7 includes a resin member 17 and a shape maintaining member 19, where the resin member 17 is made of a gel-like or rubber-like translucent resin including a phosphor material, and the shape maintaining member 19 is used for maintaining the shape of the resin member 17. The phosphor layer 7 is formed in the shape of a dome, where the shape maintaining member 19 is formed inside the resin member 17 as a bony framework thereof.

Here, with respect to the dome shape of the phosphor layer 7, the radius of the circular arc is determined such that the center of the circular arc is located at the center of light-emission. The light-emission center mentioned here is the center of the light that is emitted in the state where all the LED elements have been arranged.

Note that the shape maintaining member may be embedded in the resin member, or exposed to outside (namely, to the front surface and/or back surface of the resin member).

The shape maintaining member 19, as shown in FIG. 2, includes a lattice-shaped part 19a, an outer circumferential frame 19b, and a plurality of (in this example, two) frame pads 19c. The lattice-shaped part 19a is in the shape of a lattice in a plan view. The outer circumferential frame 19b is in the shape of a circle in a plan view. The frame pads 19c are used to fix the phosphor layer 7 to the substrate 3.

The frame pads 19c are disposed at predetermined positions (positions that are symmetric about the center of the phosphor layer 7 in a plan view) of the outer circumferential frame 19b. Ends of line-like members 20 constituting the lattice-shaped part 19a are attached to the outer circumferential frame 19b. Through holes 23 for inserting attachment screws 21 which are to fix the phosphor layer 7 to the substrate 3 are formed in the frame pads 19c, and screw holes 25 are formed in the substrate 3, respectively (see FIG. 3).

The lattice-shaped part 19a is structured with a plurality of line-like members 20. In this example, eight line-like members 20 are used in total. The line-like members 20 are formed as follows: first, two sets of four line-like members 20 are prepared; line-like members of each set are arranged in parallel with each other with a predetermined interval (equal interval) therebetween; the two sets of line-like members 20 are assembled to be perpendicular to each other; and they are fixed at the intersections.

2. Manufacturing Method

A method of manufacturing the light-emitting source having the above-described structure includes an implementing step, a sealing step, and a mounding step. In the implementing step, LED elements are implemented on the substrate (which includes the connection between the wiring pattern of the substrate and the LED elements). In the sealing step, the LED elements in the implementing step are sealed with the sealing member (in the actuality, the step is also a step for forming the sealing member). In the mounting step, the phosphor layer is mounted onto the substrate. Furthermore, a forming step for forming the phosphor layer may be performed before or simultaneously with the implementing step and/or sealing step. In either case, the forming step should be performed before the mounting step.

Of these steps in the light-emitting source manufacturing method, the implementing step and the sealing step can be performed using known technologies. Accordingly, the step for forming the phosphor layer will be mainly described here.

FIG. 5 shows a method for forming the phosphor layer. The left hand side column of FIG. 5 shows interim states of the phosphor layer, and the right-hand side column of FIG. 5 shows corresponding methods for making the interim states of the phosphor layer.

The phosphor layer is made through a first forming step, a deforming step, a second forming step, and an attaching step. The first forming step forms a flat-plate-like shape maintaining member 31 (which corresponds to State a in FIG. 5 and is, strictly speaking, a prototype of the shape maintaining member) that is composed of an outer circumferential frame and a lattice-shaped part, where the lattice-shaped part has been formed by arranging and connecting with each other a plurality of line-like members. The deforming step deforms the flat-plate-like shape maintaining member 31 into a dome-shaped shape maintaining member 33 (which corresponds to State b in FIG. 5). The second forming step forms a resin member 34 (which corresponds to State c in FIG. 5) by a translucent resin with use of the dome-shaped shape maintaining member 33 as the bony framework. The attaching step attaches a frame pad to the outer circumferential frame after the second forming step (the illustration is omitted).

The flat-plate-like shape maintaining member 31 (State a) can be transformed into the dome-shaped shape maintaining member 33 (State b) by, for example, a compression molding method (namely, the Method A shown in FIG. 5) by using a pair of molds 39 and 41. That is to say, the pair of molds 39 and 41 are respectively a male mold 39 and a female mode 41, where the male mold 39 has a convex 39a that corresponds to the curving surface of the dome-shaped shape maintaining member 33, and the female mode 41 has a concave 41a. The dome-shaped shape maintaining member 33 can be obtained by putting together the molds 39 and 41 with the flat-plate-like shape maintaining member 31 disposed therebetween.

One example of Method B for forming the resin member 34 based on the dome-shaped shape maintaining member 33 (State b) is an injection molding method (Method B shown in FIG. 5). In this method, a space 43a (whose shape corresponds to the phosphor layer) that has been formed preliminarily in a mold 43 is filled with a translucent resin in the state where the dome-shaped shape maintaining member 33 is disposed inside the mold 43. This forms the phosphor layer 35 which includes the resin member 34 in which the dome-shaped shape maintaining member 33 has been formed as a bony framework.

In the attaching step, the frame pad is attached to the outer circumferential frame, for example, by welding to obtain the phosphor layer 7.

3. Example

The following will describe an example of the light-emitting source 1 having the above-described structure.

In the substrate 3, a ceramic substrate, such as an insulating alumina, is used as the insulating layer 3a, and an aluminum plate is used as the metal base 3b. The substrate 3 is in a square shape, with each side being 30 mm in length. Note that the insulating layer 3a is 0.2 mm thick, and the metal base 3b is 1.0 mm thick.

The wiring pattern 13 is formed on the main surface of the insulating layer 3a by, for example, etching an approximately 10 micrometer thick copper foil in the predetermined pattern.

Each LED element Dnm is in the shape of a rectangular parallelepiped which is 0.2 mm high, whose bottom surface is a 1.0 mm by 1.0 mm square, and which is InGaN-based LED for emitting blue light. The distance between adjacent LED elements Dnm arranged in the row direction and the column direction (a center-to-center distance of the LED elements Dnm) is approximately 5.0 mm.

The sealing member 5 is made of resin such as silicone resin, and is approximately 1.2 mm thick. Also, in a plan view, the sealing member 5 is in the shape of a circle which is 20 mm in diameter. Note that even if silicone resin is used as the material of the sealing member 5, the shape of the sealing member 5 is maintained since the shape the sealing member 5 itself is close to flat. Also, color unevenness does not occur even if the sealing member 5 is deformed since the sealing member 5 does not include a phosphor material.

In the phosphor layer 7, the line-like members 20 in the shape maintaining member 19 are made of a stainless material, and the resin member 17 is made of a silicone resin. The phosphor layer 7 is in a dome shape which is 25 mm in diameter and 11 mm in height.

The phosphor material to be included in the silicone resin of the resin member 17 is, for example, a phosphor material that emits yellow light. With this structure, the blue light emitted from the LED element Dnm is converted in color by the phosphor material, so that white light is output from the light-emitting source 1. In the case of, for example, neutral white light, the silicone resin of the resin member 17 should contain from 8 wt % to 10 wt % (preferably, 9.1 wt %) of phosphor material. This is because the content percentage makes it possible to reduce the change over time in a desired color temperature.

The line-like members 20 constituting the shape maintaining member 19 are 0.2 mm in diameter and 190 GPa in vertical elasticity modulus. The lattice shape of the shape maintaining member 19 is formed such that distance L1, L2 (see FIG. 2) between the line-like members 20 extending in parallel with each other in the same direction is 7.0 mm.

The translucent silicone resin used in the resin member 17 is a methyl-based rubber-like silicone that has refraction index 1.42 and light transmission efficiency 85% in the visible light region. The resin member 17 is 1.0 mm thick, and is A20 in shore hardness (conforming to JISK6253).

Mode for the Invention 2

FIG. 6 shows a lighting device in Mode for the Invention 2.

A lighting device 51 includes the light-emitting source 1 described in Mode for the Invention 1, a heat sink 53 that is mounted in the light-emitting source 1 for dissipating heat from the light-emitting source 1 during lighting, a holder 55 that holds the light-emitting source 1 via the heat sink 53, a lighting circuit 57 that supplies power to the light-emitting source 1 to cause the LED elements Dnm to emit light, a case 59 that is attached to the holder 55 in the state where it houses the lighting circuit 57, a base 60 attached to the case 59, and a globe 62 that covers the light-emitting source 1 and is fixed to the holder 55 and the case 59.

The heat sink 53 is made of, for example, aluminum, and its circumferential wall is provided with a fin for dissipating heat.

The holder 55 is attached with the heat sink 53 on one side thereof, and the lighting circuit 57 on the other side. In the present example, the holder 55 is in the shape of a cylinder with bottom, where the bottom is attached with the heat sink 53.

The lighting circuit 57 is fixed in a manner where a substrate 64c is attached to the holder 55 by using locking means, fixing means or the like, in the state where a plurality of electronic parts 64a, 64b and so on have been implemented on the substrate 64c.

The base 60 is, for example, the E26 type which belongs to the E type (what is called Edison type). The base 60 is connected with the lighting circuit 57 via a lead wire (not illustrated).

The lighting circuit 57 is a known circuit that causes the LED elements Dnm to emit light by using a commercial power source. The lighting circuit 57 includes, for example, a rectifier circuit and a power adjustment circuit, where the rectifier circuit rectifies alternating power supplied from the commercial power source to direct power, and the power adjustment circuit adjusts the voltage value of the direct power having been rectified by the rectifier circuit.

The globe 62 is, for example, the A type. A light diffusion film 62a for diffusing the light emitted from the light-emitting source 1 is formed on an inner surface of the globe 62. The globe 62 also has an opening-side end 62b that is fixed by a fixing agent 58 in the state where the opening-side end 62b is inserted in a space between the circumferential wall of the holder 55 and an end of a case 59 surrounding the circumferential wall on an opening side (an end placed opposite to the base). Note that a flange 55a is formed on the entire outer circumference of the holder 55 to prevent the fixing agent 58 from flowing down.

Modifications

1. Light-Emitting Source

In Mode for the Invention 1, a plurality of (nine) LED elements Dnm are sealed by one sealing member 5, and the phosphor layer 7 is formed in a dome shape. However, not limited to this, a structure where one LED element Dnm is sealed with one sealing member may be adopted.

(1) Modification 1

FIG. 7 is a plan view of a light-emitting source 61 in Modification 1. FIG. 8 is a sectional view taken along the line B-B of FIG. 7, looking in the direction of the arrows.

The light-emitting source 61. as in Mode for the Invention 1, includes a plurality of (in this example, nine) LED elements Dnm (n and m are each a natural number of 2 or more, as is the case with Mode for the Invention 1), a substrate 63 on which the LED elements Dnm are implemented, sealing members Rnm for sealing the LED elements Dnm, and a phosphor layer 65.

The n and m in the sealing members Rnm respectively corresponds to the n and m in the LED elements Dnm. The sealing members Rnm are made of silicone resin or the like, as in Mode for the Invention 1.

The phosphor layer 65, as in Mode for the Invention 1, includes a shape maintaining member 66 and a resin member 67, where the shape maintaining member 66 is embedded in the resin member 67 as a bony framework thereof. Also, the shape maintaining member 66 includes line-like members 66a made of a stainless material, and the resin member 67 is made of a silicon silicone resin.

The phosphor layer 65, as shown in FIGS. 7 and 8, includes convex parts Cnm at positions which respectively correspond to the LED elements Dnm. The n and m in the convex parts Cnm respectively corresponds to the n and m in the LED elements Dnm.

Each of the convex parts Cnm is in a dome shape. With respect to the dome shape of the convex parts Cnm, the radius of its circular arc is determined such that the center of the circular arc is located at the center of light-emission. The light-emission center mentioned here is the center of each LED element.

The shape maintaining member 66, as shown in FIG. 7, includes a lattice-shaped part, an outer circumferential frame 68a, and frame pads 68b. The lattice-shaped part is in the shape of a lattice in a plan view. The outer circumferential frame 68a is in the shape of a square in a plan view. The frame pads 68b are used to fix the phosphor layer 65 to the substrate 63.

The phosphor layer 65 is fixed to the substrate 63 in a manner where the frame pads 68b is fixed to the substrate 63 by fixing screws 69. Note that the line-like members 66a which actually exists is hidden by the line B-B in FIG. 7.

(2) Others

In Modification 1, the sealing members Rnm and the convex parts Cnm of the phosphor layer 65 are formed respectively in correspondence with the LED elements Dnm on a one-to-one basis. However, the present invention is not limited to this structure. For example, a plurality of LED elements may be sealed with one sealing member, and the phosphor layer may include a convex part at a position corresponding to the sealing member. As another example, a plurality of LED elements may be sealed with one sealing member, and one convex part may be provided in correspondence with the sealing member. As a further example, a plurality of LED elements may be sealed with one sealing member, and convex parts may be provided at positions that respectively correspond to the plurality of LED elements (which results in as many convex parts as the LED elements).

Note that the shapes of the substrate, sealing member, convex part, and phosphor layer are not limited to those described in Mode for the Invention 1 and Modification 1, but may be other shapes.

2. Molded Resin Product (Phosphor Layer)

The molded resin product of the present invention is not limited to the structure recited in Mode for the Invention 1 above, but may have a different shape partially or as a whole. In Mode for the Invention 1 and Modification 1 described above, the phosphor layer includes a shape maintaining member and a resin member. However, not limited to this, the phosphor layer may further include other members that have other functions.

(1) Modification 2-1

FIG. 9A is a longitudinal sectional view of a molded resin product in Modification 2-1.

A molded resin product 70, as in Mode for the Invention 1, includes a shape maintaining member 71, a resin member 72a, and a resin member 72b, where the resin member 72a is made of a translucent resin including a phosphor material, and the resin member 72b includes a light diffusion material. For example, the resin member 72a including a phosphor material is formed inside the shape maintaining member 71 (on the LED element side), and the resin member 72b including a light diffusion material is formed outside the shape maintaining member 71 such that the shapes of the resin member 72a and the resin member 72b are maintained by the shape maintaining member 71.

In the molded resin product 70 as well, frame pads 73 for fixing the molded resin product 70 to the substrate are provided in the outer circumferential frame. In Modification 2, the molded resin product 70 is in a dome shape as a whole. However, as in Modification 1 (also as in the other example described in the modification), a plurality of convex parts may be provided respectively in correspondence with sealing members and LED elements.

In the present Modification 2-1, a resin member (72b) including a light diffusion material (for example, silica) is explained. However, not limited to this, the resin member may include other materials.

Furthermore, in Mode for the Invention 1 and Modifications 1 and 2-1, one resin member includes one material that has one function (the phosphor material or the light diffusion material). However, one resin member may include a plurality of materials having a plurality of functions.

(2) Shape of Convex Part

In Modes for the Invention and so on, the convex part is in a dome shape (circular arc or elliptic arc). However, not limited to this, the convex part may be, for example, in the shape of a cone (including a truncated cone) or a pyramid (including a truncated pyramid). However, from the viewpoint of preventing an occurrence of color unevenness, it is preferable that the shape of the convex part allows the light path lengths of the light, which is emitted from the light source, passing through the molded resin product to be substantially equalized.

(3) Shape

In Modes for the Invention and so on, the molded resin product includes a convex part. However, not limited to this, the molded resin product may be in a flat-plate-like shape as shown in FIG. 14, or may has a concave part. That is to say, as far as the molded resin product includes a shape maintaining member inside or outside thereof, the shape of the molded resin product is maintained, whether the resin member is gel-like or rubber-like.

FIG. 9B is a longitudinal sectional view of a molded resin product in Modification 2-2.

A molded resin product 76, as shown in FIG. 9B, includes a concave part 76a which is curved in correspondence with the light emission directions of the light emitted from an LED element 105. Note that a light-emitting source 74 in Modification 2-2 includes an LED element 105, a sealing member 75, and a molded resin product 76.

(4) Others

In Mode for the Invention 1, a phosphor material that emits yellow light is used. However, not limited to this, other phosphor materials may be used. Note that the LED elements are not limited to the ones that emit blue light. Accordingly, the phosphor material for use may be determined in accordance with the color of light emitted from the LED elements.

In Mode for the Invention 1 and so on, silicone resin is used. However, not limited to this, other resins may be used. For example, fluorine resin may be used instead, or both silicone resin and fluorine resin may be used.

The reason for using a gel-like or a rubber-like resin for the resin member is that it provides a low stress and is difficult to cause a crack during the molding of the resin member, thus making it easy to mold. Also, generally, a gel-like or a rubber-like resin has a high heat resistance, is difficult to become brittle by deterioration, and it takes a long time before it becomes brittle by deterioration since it is soft in nature. Note that, to obtain such effects, it is preferable that the translucent resin is A80 or less in hardness.

3. Method for Manufacturing Molded Resin Product

According to the method for manufacturing the molded resin product explained in Mode for the Invention 1, a flat-plate-like shape maintaining member is transformed into a dome-shaped shape maintaining member, and then the translucent resin is molded into the resin member so that the dome-shaped shape maintaining member becomes a bony framework of the resin member. However, not limited to this method, the molded resin product may be formed by another method.

(1) Modification 3

FIG. 10 shows a method for manufacturing the molded resin product in Modification 3. The left hand side column of FIG. 10 shows interim states of the phosphor layer, and the right-hand side column of FIG. 10 shows corresponding methods for making the interim states of the molded resin product.

A molded resin product 84 is made through a first forming step, a second forming step, a deforming step, and an attaching step. The first forming step forms a flat-plate-like shape maintaining member 77 (which corresponds to State d in FIG. 10) that is composed of an outer circumferential frame 77b and a lattice-shaped part, where the lattice-shaped part has been formed by arranging and connecting with each other a plurality of line-like members 77a. The second forming step forms a resin member 78 (which corresponds to State e in FIG. 10) by a translucent resin with use of the shape maintaining member 71, which is flat-plate-like, as the bony framework. The deforming step deforms the resin member 78 into a dome shape (which corresponds to State f in FIG. 10). The attaching step attaches a frame pad to the outer circumferential frame 77b after the deforming step.

One example of the method for forming the resin member 78 based on the flat-plate-like shape maintaining member 77 (State d) is an injection molding method (Method C shown in FIG. 10). In this method, a space 80a (whose shape corresponds to the three-dimensional shape of the molded resin product 84 which is flat-plate-like in State e) that has been formed preliminarily in the mold 80 is filled with a translucent resin in the state where the flat-plate-like shape maintaining member 77 is disposed inside the space 80a. This forms the flat-plate-like resin member 81 supported by the shape maintaining member 71.

The flat-plate-like resin member 81 (State e) can be transformed into the dome-shaped molded resin product 84 (State f) by, for example, a compression molding method (namely, the Method D shown in FIG. 10) by using a pair of molds 82 and 83. That is to say, the pair of molds 82 and 83 are respectively a male mold 82 and a female mode 83, where the male mold 82 has a convex 82a that corresponds to the curving surface of the molded resin product 84, and the female mode 83 has a concave 83a. The molded resin product 84 can be obtained by putting together the molds 82 and 83 with the flat-plate-like resin member 81 disposed therebetween.

(2) Others

In Mode for the Invention 1 and Modification 3, the compression molding method and the injection molding method are mainly used. However, not limited to these, for example, a transfer molding method may be used for forming the molded resin product. Furthermore, in Mode for the Invention or the like, the molded resin product is attached to the substrate or the like via frame pads that are fixed to the outer circumferential frame. However, not limited to this structure, for example, the outer circumferential frame may be directly attached to the substrate or the like.

One example of the method for directly attaching the outer circumferential frame to the substrate is as follows. First, an outer circumferential frame in the shape of a letter C which can be reduced in diameter is prepared. Also, a groove, which is smaller in diameter than the outer circumferential frame in the shape of a letter C, is formed at a scheduled attachment region in the substrate, and then the outer circumferential frame is fitted into the groove by reducing the diameter of the frame.

4. Shape Maintaining Member (1) Material

The line-like members constituting the shape maintaining member in Mode for the Invention 1 are made of a stainless material. However, not limited to stainless material, the shape maintaining member may be made of any other material which can maintain the shape of the gel-like or rubber-like resin member. For example, the material may be one of another metal (tungsten, iron, copper or the like), glass, ceramic, and resin, or a combination of two or more among them.

Also, since line-like members are embedded in the molded resin product (phosphor layer), they may make shadows when receiving the light emitted from the light-emitting source. It is therefore preferable that the line-like members are 0.4 mm or less in diameter. Furthermore, when the shape such as a lattice shape into which the line-like members are formed is taken into account, it is preferable that the line-like members are 0.3 mm or less in diameter. When the workability is taken into account, it is preferable that the line-like members are, in vertical elasticity modulus, in a range from 130 GPa to 190 GPa inclusive.

(2) Shape

In Mode for the Invention 1, the shape maintaining member is in a lattice shape in a plan view. However, not limited to this, the shape maintaining member may be in a shape other than this.

FIGS. 11A to 11F show various structures of the shape maintaining member in modifications.

A shape maintaining member 85 shown in FIG. 11A has a structure where a plurality of (in this example, three) line-like members 85a formed as concentric circles with different radii are disposed to have the same center. This structure gives the effect of increasing the force of a part whose shape, in particular, is desired to be maintained, by adjusting the circles in position, pitch or the like. For example, a larger number of circles may be disposed at the outer circumference.

A shape maintaining member 86 shown in FIG. 11B has a structure where a plurality of (in this example, four) line-like members 86a are disposed in a radial fashion at regular intervals in a circumferential direction. This structure gives the effect of improving the force for maintaining the shape against a stress (compression stress) applied from upward (in a direction perpendicular to the sheet plane).

A shape maintaining member 87 shown in FIG. 11C has a structure where a plurality of (in this example, seven) line-like members 87a and 87b are used, where three line-like members 87a formed as concentric circles with different radii are disposed to have the same center, and the remaining four line-like members 87b are disposed in a radial fashion at regular intervals in a circumferential direction. This structure gives the effect of improving the force for maintaining the shape against deforming stresses applied from every direction.

A shape maintaining member 88 shown in FIG. 11D has a structure where one line-like member 88a formed in a spiral shape is disposed such that one end thereof is disposed near the center, and the line-like member 88a extends toward the circumference (namely, towards the other end of the line-like member) gradually, winding around the center. This structure gives the effect of forming the shape maintaining member by using one line-like member.

A shape maintaining member 89 shown in FIG. 11E has a structure where a plurality of (in this example, five) line-like members 89a are disposed in parallel with each other. This structure gives the effect of forming the shape maintaining member easily (implement easily) since it merely requires disposing the line-like members in parallel with each other.

A shape maintaining member 90 shown in FIG. 11F has a structure similar to that of the shape maintaining member 89 described above, shown in FIG. 11E, except that each line-like member is in the shape of a coil. This structure gives the effect of increasing the contact area between the shape maintaining member (line-like members) and the resin, preventing a crack or removal of the molded resin product from occurring, thus resulting in improvement of the reliability of the molded resin product.

Note that the structure of the shape maintaining member may be any combination of the six types of structures that have been described above. For example, one piece of the coil-like shape maintaining member 90 shown in FIG. 11F may be formed in a spiral shape as a whole as shown in FIG. 11D.

In these modifications, the outer circumference of the shape maintaining member is in the shape of a circle in a plan view. However, not limited to this, the outer circumference of the shape maintaining member may be in the shape of a polygon such as a triangle, or in the shape of an ellipse. Also, the outer circumference frame may be structured with line-like members or belt-like members. When the outer circumference frame is structured with line-like members, the line-like members may be different from the line-like members used in the lattice-like member, in thickness, material (including a material that is different in elasticity modulus), or the like.

5. Lighting Device

In Mode for the Invention 2, the molded resin product (phosphor layer) 7 is included in the light-emitting source 1, and the light-emitting source 1 is attached to the substrate 3. However, the molded resin product may not be included in the light-emitting source.

FIG. 12 shows a lighting device in Mode for the Invention 2.

A lighting device 91 includes the light-emitting source 92, a heat sink 93 that is mounted in the light-emitting source 92 for dissipating heat from the light-emitting source 92 during lighting, a holder 94 that holds the light-emitting source 92 via the heat sink 93, a lighting circuit 57 that supplies power to the light-emitting source 92 to cause the LED elements Dnm to emit light, a case 59 that is attached to the holder 94 in the state where it houses the lighting circuit 57, a base 60 attached to the case 59, a molded resin product (phosphor layer) 95 that covers the light-emitting source 92 and is fixed to the holder 94, and a globe 62 that covers the molded resin product 95 and is fixed to the holder 94 and the case 59.

As described above, the molded resin product 95 is attached to the holder 94 to which the light-emitting source 92 is attached. The molded resin product 95, as shown in FIG. 12, is in the shape of a circle as a whole. This structure also allows the light path lengths of the light, which is emitted from the light-emitting source 92, passing through the molded resin product 95 to be equalized, preventing the color unevenness from occurring.

INDUSTRIAL APPLICABILITY

The light-emitting source and the lighting device of the present invention are applicable to those that are provided with a phosphor layer made of gel-like or rubber-like resin that can maintain its shape for a long period and that can be implemented easily.

The invention claimed is:

1. A molded resin product, comprising:
   a resin member that is substantially uniform in thickness and made of a translucent resin including a phosphor material; and
   a shape maintaining member including:
      a lattice-shaped part that is composed of a plurality of thin line shaped members that are made of at least one material selected from the group consisting of metal, ceramic and resin having a higher elasticity modulus than the resin member, and the shape maintaining member is embedded to be enclosed within an interior of the resin member to maintain a shape of the resin member and is in a lattice shape in a plan view;
      an outer circumferential frame disposed at a circumference of the lattice-shaped part; and
      a frame pad attached to the outer circumferential frame and fixing the resin member to another member, wherein
   the frame pad is not covered with the resin member.

2. The molded resin product of claim 1, wherein the resin member has one of a gel elasticity and a rubber elasticity.

3. The molded resin product of claim 1, wherein the resin member is A80 or less in Shore hardness.

4. The molded resin product of claim 1, wherein the translucent resin includes at least one of a silicone resin and a fluorine resin.

5. The molded resin product of claim 1, wherein the resin member includes, either inside or in an outer surface thereof, at east one of a pigment and a light diffusion material.

6. A semiconductor light-emitting source, comprising:
   a substrate that is provided with a wiring pattern on a main surface thereof;
   a semiconductor light-emitting element on the substrate; and
   the molded resin product recited in claim 1.

7. A lighting device characterized by comprising the semiconductor light-emitting source recited in claim 6, as a light source.

8. A molded resin product for use with a semiconductor light-emitting element as a light source, comprising:
   a resin member that is substantially uniform in thickness and made of a translucent resin including a phosphor material for transmitting light from the semiconductor light-emitting element; and
   a shape maintaining member including
      a lattice-shaped part that is composed of one or more thin line shaped members that are made of at least one material selected from the group consisting of metal, ceramic and resin having a higher elasticity modulus than the resin member, the shape maintaining member is embedded to be enclosed within an interior of the resin member to maintain a shape of the resin member;
      an outer circumferential frame is disposed at a circumference of the lattice-shaped part; and
      a frame pad is attached to the outer circumferential frame for fixing the resin member to another member, wherein
   the frame pad is not covered with the resin member, wherein
   the resin member has a convex part whose inside is a hollow space;
   the convex part is in a shape of a circular arc in a longitudinal section, and a radius of the circular arc is determined such that a center of light emission is located in a vicinity of or at a center of the circular arc, and the shape maintaining member, in a plan view, is in a lattice shape.

* * * * *